United States Patent
Maurin-Perrier et al.

(10) Patent No.: US 9,011,655 B2
(45) Date of Patent: Apr. 21, 2015

(54) DEVICE FOR GENERATING COLD PLASMA IN A VACUUM CHAMBER AND USE OF SAID DEVICE FOR THERMO-CHEMICAL PROCESSING

(75) Inventors: Philippe Maurin-Perrier, St Marcellin en Forez (FR); Hervé Chavanne, St Just St Rambert (FR); Laure Poigt, La Talaudiere (FR)

(73) Assignee: H.E.F., Andrezieux Boutheon (FR)

(*) Notice: Subject to any disclaimer, the term of this patent is extended or adjusted under 35 U.S.C. 154(b) by 392 days.

(21) Appl. No.: 12/526,904

(22) PCT Filed: Feb. 1, 2008

(86) PCT No.: PCT/FR2008/050166
§ 371 (c)(1),
(2), (4) Date: Aug. 12, 2009

(87) PCT Pub. No.: WO2008/104669
PCT Pub. Date: Sep. 4, 2008

(65) Prior Publication Data
US 2010/0116643 A1    May 13, 2010

(30) Foreign Application Priority Data

Feb. 15, 2007 (FR) .................... 07 53289

(51) Int. Cl.
| | |
|---|---|
| C23C 14/00 | (2006.01) |
| C25B 11/00 | (2006.01) |
| C25B 13/00 | (2006.01) |
| H05H 1/24 | (2006.01) |
| H01J 37/32 | (2006.01) |

(52) U.S. Cl.
CPC ............ *H05H 1/24* (2013.01); *H01J 37/32596* (2013.01)

(58) Field of Classification Search
USPC ........................ 204/298.04, 298.16
See application file for complete search history.

(56) References Cited

U.S. PATENT DOCUMENTS

| | | | | |
|---|---|---|---|---|
| 4,637,853 A * | 1/1987 | Bumble et al. | ......... | 156/345.45 |
| 5,113,790 A | 5/1992 | Geisler et al. | | |
| 5,482,611 A * | 1/1996 | Helmer et al. | ......... | 204/298.17 |
| 6,066,826 A | 5/2000 | Yializis | | |
| 2002/0148725 A1* | 10/2002 | Subramani et al. | ...... | 204/298.19 |
| 2003/0106643 A1* | 6/2003 | Tabuchi et al. | ......... | 156/345.35 |
| 2003/0161969 A1* | 8/2003 | Hilliard | ..... | 204/298.07 |
| 2004/0020768 A1* | 2/2004 | Wang et al. | ................ | 204/298.2 |

FOREIGN PATENT DOCUMENTS

EP    0881865 A2    12/1998

OTHER PUBLICATIONS

The International Search Report for PCT/FR2008/050166, dated Aug. 20, 2008.

* cited by examiner

*Primary Examiner* — Keith Hendricks
*Assistant Examiner* — Ibrahime A Abraham
(74) *Attorney, Agent, or Firm* — Heslin Rothenberg Farley & Mesiti P.C.

(57) ABSTRACT

A device for generating a cold plasma in a vacuum enclosure includes a cathode body having hollow chambers for confining the plasma. Magnets are placed around each hollow chamber for creating a magnetic field forcing electrons to rotate about the field lines. The cathode body cooperates with an element for circulating a coolant to extract the heat generated by an intense ion bombardment at each of the hollow chambers.

14 Claims, 4 Drawing Sheets

DEVICE FOR GENERATING COLD PLASMA IN A VACUUM CHAMBER AND USE OF SAID DEVICE FOR THERMO-CHEMICAL PROCESSING

CROSS REFERENCE TO RELATED APPLICATIONS

This application is a mational stage filing under section 371 of International Application No. PCT/FR2008/050166 filed on Feb. 1, 2008, and published on Nov. 6, 2008 as WO 2008/1044669 and claims priority of French application No. 0753289 filed on Feb. 15, 2007 the entire disclosure of these applications being hereby incorporated herein by reference.

BACKGROUND ART

The invention relates to a device for generating a cold plasma in an enclosure under reduced pressure, and relates more particularly to a cathode suitable for generating a high-power cold plasma.

A person skilled in the art is perfectly familiar with the industrial use of cold plasmas for altering the surface of various types of materials, in order to create active species, out of equilibrium, which do not exist in the natural state. The use of plasmas in thermochemical treatment allows accurate control of the concentration of active species, as opposed to conventional methods. Low-pressure cold plasmas further serve to significantly limit the gas consumption, which is advantageous, both economically and ecologically.

Various technical solutions have been proposed for generating a plasma under reduced pressure.

According to one solution, the parts to be treated are directly polarized. A luminescent discharge is created in the near vicinity of the surface, thereby exciting the gas mixture selected. This technique is widely used in case hardening or ion nitriding, but creates heterogeneities of treatment according to the geometry and the arrangement of the parts with regard to one another. In fact, the natural intensification of the plasma in particular zones, such as holes, edges, etc., causes local overheating which unfavourably affects the quality of the treatment. It also appears in this technique that the substrates are subject to intense ion bombardment, which alters their surface.

Another solution appears from the teaching of patent FR 2 702 119 which uses an antenna for injecting a body wave into the enclosure, like a microwave oven. The main drawback of this technology is that antennas are point sources which can rarely inject more than 200 W. It is therefore necessary to increase the number of sources to have a uniform plasma in an industrial enclosure. This causes an increase in the size, costs and risks of failure. This type of antenna only serves to inject a microwave signal (no DC nor pulsed-DC nor RF signals) and only provides its best yield in the particular physical conditions of electron cyclotron resonance.

Another solution appears from the teaching of patent FR 2 766 321 which relates to a gas excitation device comprising a hollow structure forming a waveguide, the structure being connected to a generator, while means circulate the gas through the structure. A plasma is created outside the structure or enclosure, in a hollow tube made from dielectric material. The results obtained are only satisfactory at relatively high pressures for a vacuum technology (higher than 5 mbar), which causes gas flow problems inside the enclosure, hence a treatment heterogeneity.

Another solution appears from the teaching of patent EP 0 872 569 which relates to an ion bombardment nitriding method, in which a plasma is generated in a furnace. A current is conveyed to the metal lattice cathode, which surrounds the articles to be treated, the anode consisting of the furnace walls. The cathodes used are generally ineffective for creating large quantities of active species. The ion bombardment to which the cathodes are subjected causes their heating, which contributes to the heating of the parts, making it impossible to dissociate the temperature of the parts from the generation of the plasma (hence of the active species). A further drawback encountered with this type of cathode is its sputtering due to high voltages (about 500 volts), causing pollution of the substrates.

To remedy these drawbacks, in order to limit the voltage of the cathode, it has been proposed to confine the plasma in holes in order to intensify it and to lower the voltage. One solution of this type appears from the teaching of patent EP 0 881 865, which relates to a device for producing a plurality of low-temperature plasma jets by means of a high frequency power source, using discharges. The device comprises a plurality of individual hollow cathode chambers, each plasma jet being associated with an individual hollow cathode chamber, as a discharge enclosure. Among the drawbacks generated with this solution, a power imbalance may be observed between the holes, and the total power is always deliberately maintained at a level often lower than 1 kW, due to the overheating of the assembly resulting from a very intense ion bombardment in the holes.

It is the object of the invention to remedy these drawbacks simply, safely and effectively.

BRIEF SUMMARY OF THE INVENTION

The problem that the invention proposes to solve is to generate high-power cold plasmas, in a reduced pressure enclosure, by dissociating the temperature of the substrates from the creation of the active species, in order to carry out various types of surface treatment such as ion spallation, thermochemical treatments, activation, grafting, stripping, etc.

To solve such a problem, the device uses a cathode having hollow chambers for the electrostatic confinement of the plasma. According to the invention, considering the problem to be solved, each hollow chamber is subject to means suitable for creating a magnetic field forcing the electrons to rotate about the field lines, the cathode body cooperating with an element suitable for circulating a coolant to extract the heat generated by an intense ion bombardment at each of the hollow chambers.

To solve the problem of increasing the number of collisions between the electrons and the surrounding gas molecules, in order to increase the production rate of active species, the means for creating a magnetic field consist of magnets.

Advantageously, the magnets are placed around and parallel to the hollow chambers. The magnets are placed in holes communicating with the coolant, the hollow chambers terminating on the vacuum side, in the enclosure.

To solve the problem of extracting the heat generated by the intense ion bombardment in the holes of the cathode, either the element suitable for circulating a coolant is independent of the cathode body, and is fixed thereto, in a sealed manner, or the said element and the cathode body constitute a single unit.

The cathode body and the element for circulating a fluid are made from a non-magnetic material, electrically and thermally conductive.

According to this basic design, either the magnets preferably have the same North-South orientation (FIG. 2), or have an alternate distribution (FIG. 3), or a random orientation (FIG. 4).

The magnetic configurations apply according to the width or the length of the cathode (FIG. 5).

In one embodiment, the magnetic field is generated by cylindrical magnets fixed in the holes of the cathode body.

The invention also relates to the use of the device for thermochemical treatments such as nitriding, case hardening, etc.

BRIEF DESCRIPTION OF THE DRAWING FIGURES

The invention is discussed in greater detail below in conjunction with the figures of the appended drawings in which.

DETAILED DESCRIPTION

Figure 5:
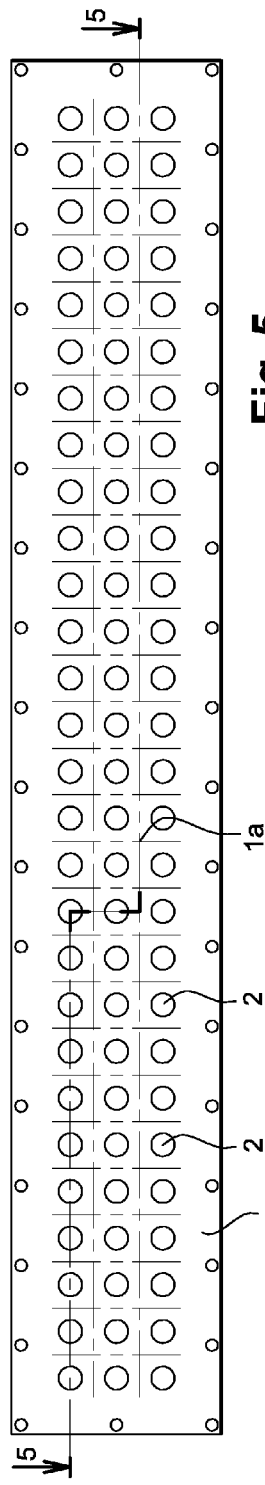
FIG. 5 is an underside view of an exemplary embodiment of the cathode.
Figure 6:
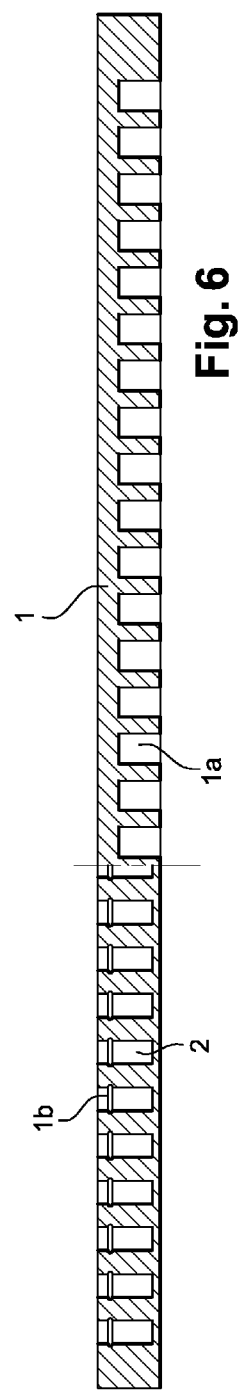
FIG. 6 is a longitudinal cross section along jogged line 5-5 in FIG. 5 illustrating magnets arranged in a longitudinal cross section different than a longitudinal cross section containing the hollow chambers, each longitudinal cross section extending parallel to a side of the cathode body.
Figure 9:
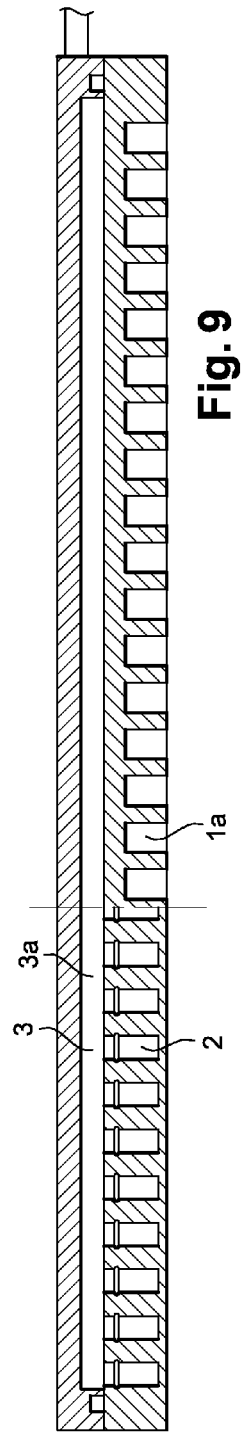
FIG. 9 is a longitudinal cross section of the cathode equipped with the cooler.

The cathode body, denoted by (1), comprises a plurality of hollow chambers (1a) for confining the plasma. The confinement of the plasma in the hollow chambers (1a) serves to intensify it and to increase the creation of active species. Each hollow chamber (1a) is subjected to means (2) for creating a magnetic field forcing the electrons to rotate about the field lines. The said means (2) consist of magnets placed around and parallel to the hollow chambers in separate, spaced apart holes (1b) surrounding each hollow chamber (1a), e.g. four magnets equally spaced apart in four quadrants surrounding each hollow chamber as illustrated in FIG. 5. This has the effect of increasing the number of collisions of the electrons with the molecules of surrounding gas, thereby increasing the rate of production of the active species.

Figure 7:
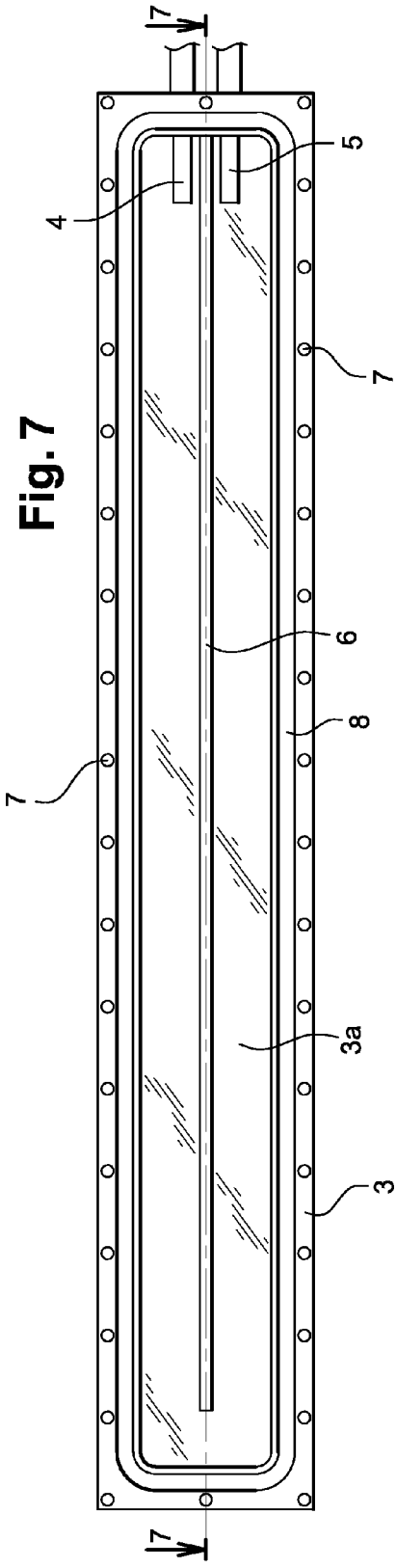
FIG. 7 is a plan view of the cooler.
Figure 8:
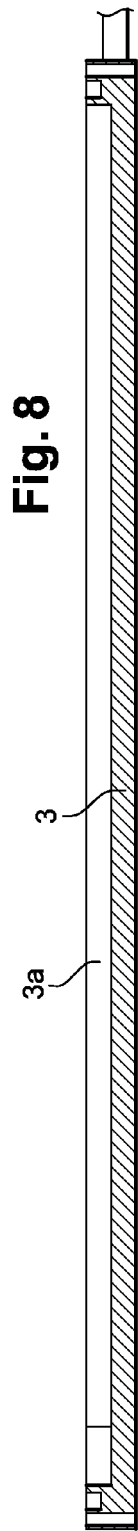
FIG. 8 shows a longitudinal cross section along line 7-7 in FIG. 7.

The cathode body (1) cooperates with a cooler (3) for circulating a coolant to extract the heat generated by an intense ion bombardment in each of the hollow chambers (1a). The said cooler (3) has a central recess (3a) acting as a basin orifice communicating with a water inlet (4) and a water outlet (5). FIG. 7 shows the circulation of the coolant, the water entering at (4) circumventing a central rod (6) and being removed at (5). The cooler (3) is flanged to the cathode body (1) by screws (7) placed at the periphery, the seal being provided by an O-ring (8).

In this closure position the holes (1b) in which the magnets are placed communicate with the coolant and therefore, the coolant is circulated to the magnets (2) in these holes (1b) to extract heat. It may be observed that the magnets (2) are of the permanent type and consist of cylindrical bodies fixed in the holes (1b) of the cathode body (1). The various hollow chambers (1a) terminate on the vacuum side of the enclosure.

The cooler (3) may have dimensions larger than those of the cathode body, to permit the fastening of the assembly (cathode-cooler) to any support via the screws.

The cooling of the cathode (1) prevents its overheating, and also that of the substrates in the enclosure. These arrangements make feasible a low temperature treatment demanding a large quantity of active species, without the cathode substantially contributing to the temperature of the parts. The said cooling also guarantees the magnetic stability of the magnets (2) of which the magnetic field decreases with increasing temperature.

The cathode body (1), and the cooler (3) are made from a non-magnetic and conductive material, such as austenitic stainless steels, aluminium, chromium, graphite or titanium.

As it appears from the figures of the drawings, and as stated above, the cooler (3) and the cathode body (1) constitute two distinct elements.

While remaining within the scope of the invention, it is possible to consider a one-piece assembly (1-3). In this case, the cathode body incorporates a water circuit, in order to cool it effectively. In this embodiment, various solutions can be considered for the water circuit. For example, by drilling lines or by welding tubes or other elements to the surface.

Figure 1:
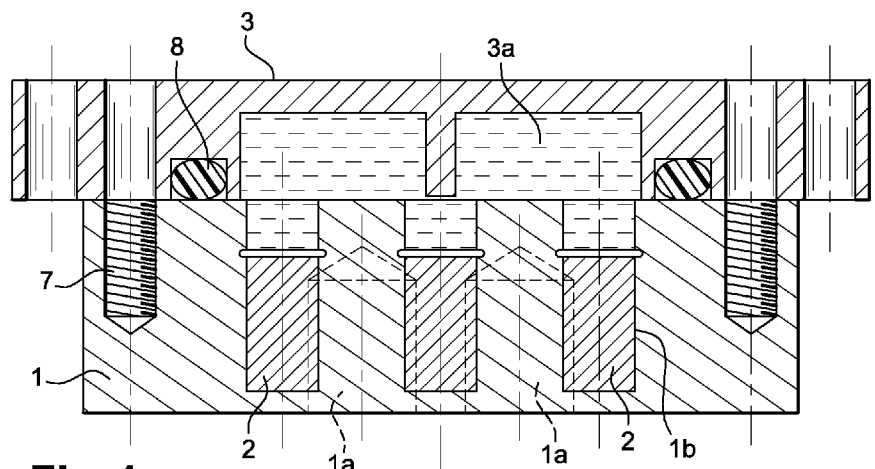
FIG. 1 is a cross section showing the principle of the device according to the invention.
Figure 2:
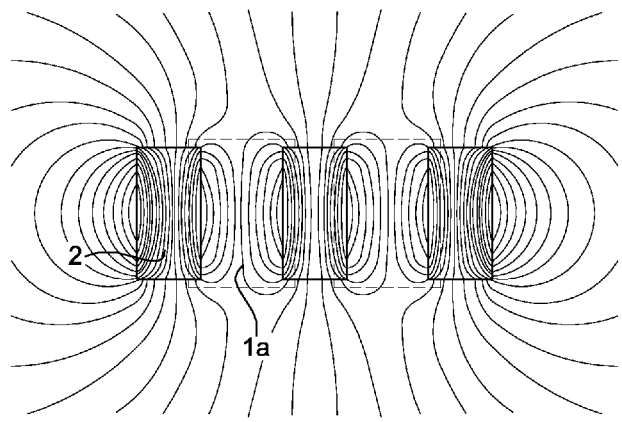
FIGS. 2, 3 and 4 are views showing the field lines according to the orientation of the magnets.
Figure 3:
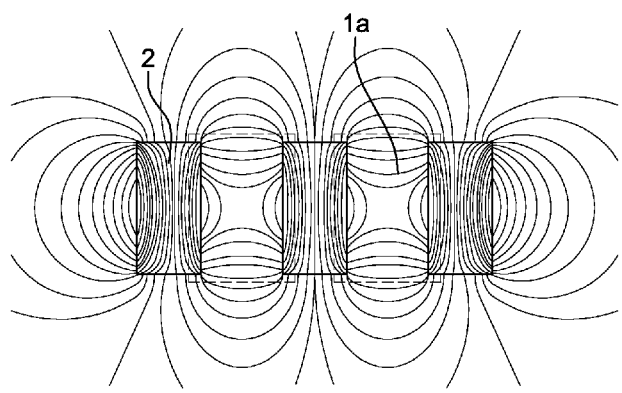
Figure 4:
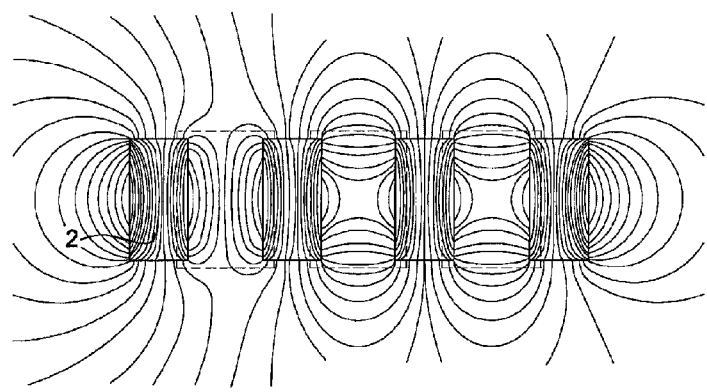

FIGS. 2, 3 and 4 show the field lines created by the magnets (2) which may be randomly oriented, FIG. 4, or alternately oriented, FIG. 3, but preferably have the same North-South orientation, FIG. 2. The resulting field lines are looped in the hollow chambers (1a) of the cathode and are parallel thereto.

It is possible to select different magnetic configurations for each row of three magnets (for example, one line as in FIG. 2, then a line as in FIG. 3, etc.).

It should be noted that the fastening of the magnets (2) in the holes (1b) of the cathode body is carried out by any known means such as circlips. Optionally, the magnets may be crimped in their housing. Since the cathode is cooled, the magnets (2) may consist of a material having a low curie temperature such as neodymium-iron-boron, or ferrites, but also magnets having a high curie temperature such as AlNiCo or even samarium-cobalt.

The cathode may be supplied either with a DC current or a pulsed DC current, or by a low frequency current, or by a radiofrequency current (RF). At equivalent power, the radiofrequency current has the advantage of limiting the sputtering of the cathode and of supplying a more stable discharge than in the other power supply modes. Table 1 shows the voltages observed (at 600° C. in ambient conditions) on the cathode for a pressure of $10^{-1}$ mbar and for a mixture of argon, nitrogen and hydrogen.

TABLE 1

Voltages measured on the cathode according to the excitation mode.

| Type of Power Supply | Voltage Measured on the Cathode in Volts (Incident Power: 2 kW) |
|---|---|
| DC | 550 |
| Pulsed-DC at 250 kHz | 450 |
| RF at 13.56 MHz | 155 |

For a pressure of about $10^{-1}$ mbar, at 200 V, the sputtering of the cathode holes becomes very low, giving it a long service life: after more than 500 hours of operation (at 4.5 W/cm$^2$), the wear measured in the holes (1a) of the cathode (1) proved to be low (less than 1 mm at radius) and very uniform.

Confidential tests served to demonstrate the major advantages obtained by the features of the cathode according to the invention, essentially resulting from the combination of hollow chambers, magnets, and their cooling.

The power applied to the cathode may be several kW. With a non-cooled cathode, the low-temperature treatments must be accompanied by a decrease in the power (hence decrease in the density of active species) in order to limit the heating of the cathode by the ion bombardment. With a cooled magnetic hollow cathode according to the invention, even after 5 hours of operation at 2 kW (or 6 W/cm$^2$ if one considers that most of the power is located in the holes), the temperature in the enclosure does not exceed 150° C., which is unobtainable with the other types of cathodes, as defined in the prior art.

Contrary to the DC and pulsed-DC currents, the radiofrequency current (RF) has the advantage of delivering a stable discharge regardless of the temperature. Table 2 gives examples of voltages observed as a function of the temperature and the maximum pressure below which the plasma is extinguished in the holes.

TABLE 2

| Type of Power Supply | Voltage Measured at 20° (V) | Voltage Measured at 500° C. (V) | Plasma Extinction Pressure at 20° C. (mbar) | Plasma Extinction Pressure at 500° C. (mbar) |
| --- | --- | --- | --- | --- |
| DC | 350 | 500 | 0.120 | 0.250 |
| Pulsed-DC | 250 | 430 | 0.090 | 0.180 |
| RF (13.56 MHz) | 150 | 155 | 0.001 | 0.001 |

The voltage drift as a function of temperature for the DC and pulsed-DC discharges is highly unexpected, particularly since the drift does not exist with the RF discharges.

In theory, the magnetic field configuration as shown in FIG. 2 does not permit the electrons to pass from one hole to the next. However, as soon as the plasma is illuminated in a hole, it is immediately illuminated in all the other holes, whereas this does not occur in the absence of magnets.

The optimal size of the holes depends on the working pressure: the lower the pressure, the larger the hole diameter. The service range of cooled magnetic hollow cathodes extends between 10$^{-5}$ and 30 mbar. The corresponding hole diameters vary between 100 and 0.1 mm. In all cases, it is preferable for the depth of the holes to be at least equal to their diameter to optimize the discharge yield.

Nitriding tests were carried out with a cooled magnetic hollow cathode according to the invention, comprising 32 holes having a diameter of 16 mm and 51 magnets having a diameter of 10 mm. The dimensions of the cathode used were: 400×80×50 mm.

In a mixture of argon (50%), nitrogen (30%) and hydrogen (20%), a 10 µm combination layer is formed on a 42CrMo4 in 4 hours at 580° C., at a pressure of 10$^{-1}$ mbar and a power of 1500 W RF on the cathode. In the same conditions, the use of a conventional cathode (without holes or magnets) can only produce a layer of 2 to 3 µm.

With a nitrogen-poor mixture (10% diluted in 90% hydrogen), it is possible to avoid the formation of a combination layer, regardless of the temperature, for applications in which the said layer is undesirable: work with impacts, PVD deposits after nitriding, etc.

Figure 10:
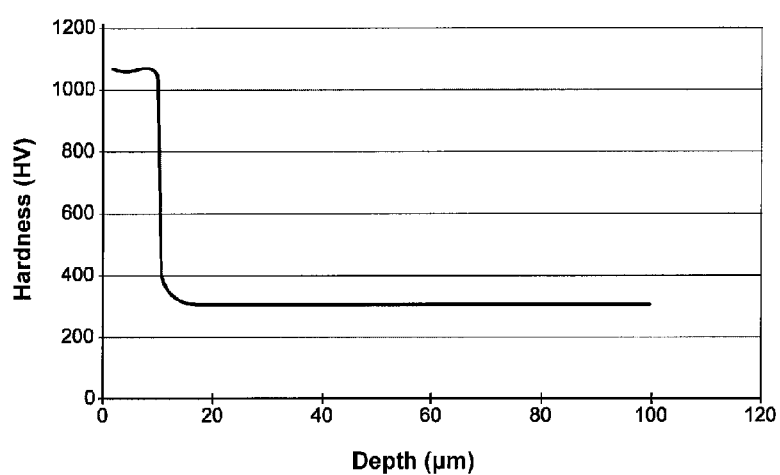
FIG. 10 shows a curve of hardness as a function of depth in the case of an austenitic stainless steel (304L) nitrided using the device according to the invention.

It was also possible to nitride stainless steels at temperatures as low as 400° C. (hence without any loss of anti-corrosion properties) while preserving the high powers on the cathode (>2 kW). A hardening on 10 µm was measured on an austenitic stainless steel (304L) after 24 hours of treatment at 400° C. (see FIG. 10).

It should be observed that to increase the size of the cathode, it suffices to increase its length by repeating the basic pattern (a hole surrounded by four magnets, for example), or to increase its width by adding new rows of holes and magnets. The shape of the cathode can be adapted to any type of enclosure: it may be round, square or rectangular.

The advantages clearly appear from the description.

The invention claimed is:

1. Device for generating a cold plasma in a vacuum enclosure for producing active species for a thermochemical treatment, comprising a cathode body having hollow chambers for confining the plasma, the hollow chambers extending from a vacuum side of the cathode body into the cathode body along spaced apart respective longitudinal axes, and magnets placed in separate spaced apart holes in the cathode body around and alongside each respective hollow chamber and oriented parallel to said longitudinal axes creating a magnetic field forcing electrons to rotate about field lines increasing number of collisions of the electrons with molecules of surrounding gas thereby increasing rate of production of the active species for the thermochemical treatment, the holes in the cathode body extending into the cathode body from a second surface of the cathode body opposite the vacuum side, the holes being open to receive coolant, and a cooler secured to the second surface of the cathode body for circulating a coolant to the magnets to extract heat generated by an intense ion bombardment at each of the hollow chambers, the cooler having a central recess acting as a coolant basin in fluid communication with a coolant inlet, a coolant outlet and the magnets located in the separate, spaced apart holes in the cathode body, and wherein a longitudinal cross section containing the hollow chambers and extending parallel to a side of the cathode body contains no magnets.

2. Device according to claim 1, wherein the holes do not extend to the vacuum side.

3. Device according to claim 1, wherein the cooler for circulating a coolant is independent of the cathode body while being fixed thereto, in a sealed manner.

4. Device according to claim 1, wherein the cooler for circulating a coolant and the cathode body consist of a single unit.

5. Device according to claim 1, wherein the cathode body and the cooler for circulating a fluid, are made from a non-magnetic and conductive material.

6. Device according to claim 1, wherein the magnets all have a same North-South orientation.

7. Device according to claim 1, wherein the magnets are randomly oriented.

8. Device according to claim 1, wherein the magnets have an alternate orientation.

9. Device according to claim 1, wherein the magnets comprise permanent magnets having a cylindrical body fixed in holes of the cathode body.

10. Device according to claim 1, in combination with a power source and a gas supply for performing the thermochemical treatment.

11. Device according to claim 1, in combination with a power source and a nitrogen gas supply for nitriding.

12. Device according to claim 1, wherein the magnets are arranged in a longitudinal cross section different than a longitudinal cross section containing the hollow chambers, each longitudinal cross section extending parallel to a side of the cathode body.

13. Device according to claim 1, in combination with a power source supplying radiofrequency current to the cathode body that generates the cold plasma and limits cathode sputtering.

14. The device according to claim 1, wherein the coolant comprises water, the coolant inlet and the coolant outlet are located at a same end of the central recess, the central recess includes a central rod, and the coolant circulates in the coolant recess from the coolant inlet along one side of the central rod and returns along an opposite side of the coolant rod to the coolant outlet.

* * * * *